(12) United States Patent
Jo et al.

(10) Patent No.: US 7,186,311 B2
(45) Date of Patent: Mar. 6, 2007

(54) PROCESS FOR PRODUCING SUBSTRATE FOR FLEXIBLE CIRCUIT BOARD

(75) Inventors: Kyouyuu Jo, Osaka (JP); Yasufumi Miyake, Osaka (JP)

(73) Assignee: Nitto Denko Corporation, Osaka (JP)

( * ) Notice: Subject to any disclaimer, the term of this patent is extended or adjusted under 35 U.S.C. 154(b) by 280 days.

(21) Appl. No.: 11/006,698

(22) Filed: Dec. 8, 2004

(65) Prior Publication Data
US 2005/0150595 A1     Jul. 14, 2005

(30) Foreign Application Priority Data
Dec. 10, 2003     (JP)     ............... P.2003-411141

(51) Int. Cl.
*B32B 37/00*     (2006.01)
(52) U.S. Cl. ............... 156/309.6; 156/313; 156/330.9; 428/458
(58) Field of Classification Search ............. 156/308.2, 156/309.6, 313, 330.9; 428/337, 458, 473.5, 428/480
See application file for complete search history.

(56) References Cited

U.S. PATENT DOCUMENTS 6,379,784 B1 * 4/2002 Yamamoto et al. ......... 428/216
7,101,455 B1 * 9/2006 Hase et al. ................. 156/247

FOREIGN PATENT DOCUMENTS

| JP | 0221592 A | * | 2/1989 |
| JP | 2001170953 A | * | 6/2001 |
| JP | 2002-326308 A | | 11/2002 |

OTHER PUBLICATIONS

WO 01/32418 A1 May, 2001.*
Abstract for JP 0221592.*
Abstract for JP 2001170953.*

* cited by examiner

*Primary Examiner*—Jeff H. Aftergut
*Assistant Examiner*—John L. Goff
(74) *Attorney, Agent, or Firm*—Sughrue Mion, PLLC

(57) ABSTRACT

The invention provides a process for producing a substrate for flexible circuit boards which comprises: providing a multilayered insulating resin layer comprising an insulating layer and an adhesive layer; and laminating a metal foil to the insulating layer of the multilayered insulating resin layer via the adhesive layer at a temperature not lower than the glass transition temperature of the insulating layer.

4 Claims, 2 Drawing Sheets

PROCESS FOR PRODUCING SUBSTRATE FOR FLEXIBLE CIRCUIT BOARD

FIELD OF THE INVENTION

The present invention relates to a process for producing a flexible-circuit substrate for use in producing flexible printed wiring boards.

BACKGROUND OF THE INVENTION

Flexible printed wiring boards have been used in various electrical appliances or electronic appliances. For the purpose of realizing size reduction and weight reduction in these electrical and electronic appliances, the wiring patterns on the flexible printed wiring boards have come to be formed at higher densities and the flexible printed wiring boards have come to have miniaturized parts mounted thereon at higher densities.

In general, the wiring pattern on a flexible printed wiring board is formed by laminating a copper foil as a metal foil to an insulating layer, e.g., a polyimide film, with heating by means of a thermosetting adhesive, further elevating the temperature thereof to cure the thermosetting adhesive, and then etching the copper foil (see, for example, patent document 1).

Patent Document 1: JP 2002-326308 A

However, after the selective removal of the copper foil by etching, the actual dimensions of the flexible printed wiring board change considerably from the design dimensions due to the internal stress which has accumulated in the flexible printed wiring board. As a result, there are cases where parts to be mounted are mounted in positions shifted from the design positions, making it impossible to connect the mounted parts to the flexible printed wiring board.

SUMMARY OF THE INVENTION

An object of the invention is to provide a process for producing a substrate for flexible circuit boards which is effective in preventing the actual dimensions of a flexible printed wiring board from changing considerably from the design dimensions after metal foil etching.

Other objects and effects of the invention will become apparent from the following description.

(1) The invention provides, in a first aspect, a process for producing a substrate for flexible circuit boards which comprises:

providing a multilayered insulating resin layer comprising an insulating layer and an adhesive layer; and laminating a metal foil to the insulating layer of the multilayered insulating resin layer via the adhesive layer at a temperature not lower than the glass transition temperature of the multilayered insulating resin layer.

In this process of the invention for producing a substrate for flexible circuit boards, the substrate for flexible circuit boards is formed by laminating a metal foil to the insulating layer via an adhesive layer at a temperature not lower than the glass transition temperature of the multilayered insulating resin layer. Due to this constitution, the flexible printed wiring board can be inhibited from suffering the dimensional change caused by internal stress after the etching of the metal foil of the flexible-circuit substrate. Consequently, parts to be mounted can be mounted on the flexible printed wiring board at the precise positions where the parts are to be mounted.

In a preferred embodiment, the temperature not lower than the glass transition temperature of the insulating layer is from 100° C. to 400° C., and the multilayered insulating resin layer has a modulus of elasticity of from $1.0 \times 10^8$ Pa to $1.0 \times 10^{10}$ Pa at the temperature at which the metal foil is laminated to the multilayered insulating resin layer.

This constitution is effective in further diminishing the dimensional change of the flexible printed wiring board caused by internal stress after the etching of the metal foil of the flexible-circuit substrate.

(2) The invention further provides, in a second aspect, a process for producing a substrate for flexible circuit boards which comprises:

providing a multilayered insulating layer comprising an insulating layer having an adhesive layer on both side thereof; and laminating a metal foil to both sides of the multilayered insulating layer via the respective adhesive layers at a temperature not lower than the glass transition temperature of the multilayered insulating resin layer.

In this process of the invention for producing a substrate for flexible circuit boards, the substrate for flexible circuit boards is formed by laminating metal foils to the insulating layer via adhesive layers at a temperature not lower than the glass transition temperature of the multilayered insulating resin layer. Due to this constitution, the flexible printed wiring board can be inhibited from suffering the dimensional change caused by internal stress after the etching of the metal foils of the flexible-circuit substrate. Consequently, parts to be mounted can be mounted on the flexible printed wiring board at the precise positions where the parts are to be mounted.

In a preferred embodiment, the temperature not lower than the glass transition temperature of the multilayered insulating resin layer is from 100° C. to 400° C., and the multilayered insulating resin layer has a modulus of elasticity of from $1.0 \times 10^8$ Pa to $1.0 \times 10^{10}$ Pa at the temperature at which the metal foils are laminated to the multilayered insulating resin layer.

This constitution is effective in further diminishing the dimensional change of the flexible printed wiring board caused by internal stress after the etching of each metal foil of the flexible-circuit substrate.

In the present invention, when the measurement result of the glass transition temperature of the multilayered insulating resin layer shows a plurality of grass transition temperatures, the higher or the highest glass transition temperature is taken as the "glass transition temperature of the multilayered insulating resin layer". For example, when two glass transition temperatures attributable to the insulating layer and the adhesive layer, respectively, are observed and the former is higher than the latter, the glass transition temperature of the insulating layer is taken as the "glass transition temperature of the multilayered insulating resin layer".

According to the process of the invention for producing a substrate for flexible circuit boards, the flexible printed wiring board can be inhibited from suffering the dimensional change caused by internal stress after the etching of the metal foil(s) of the flexible-circuit substrate. Consequently, parts to be mounted can be mounted on the flexible printed wiring board at the precise positions where the parts are to be mounted.

Figure 1:
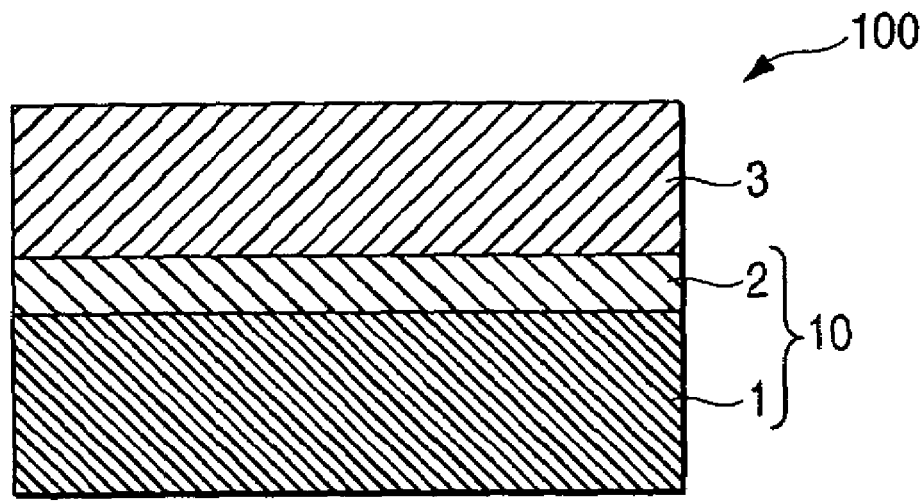
FIG. 1 is a sectional view illustrating one embodiment of the constitution of the substrate for flexible circuit boards according to the first aspect of the invention.

The reference numerals used in the drawings denote the followings, respectively.

1: insulating layer
2: adhesive layer
3: metal foil
10: first multilayered insulating resin sheet
20: second multilayered insulating resin sheet
100: substrate for single-sided flexible circuit board
101: substrate for double-sided flexible circuit board

DETAILED DESCRIPTION OF THE INVENTION

First Aspect

FIG. 1 is a sectional view illustrating one embodiment of the constitution of the substrate for flexible circuit boards according to the first aspect of the invention (This embodiment may be hereinafter sometimes referred to as "first embodiment"). The flexible-circuit substrate according to this embodiment is a substrate for single-sided flexible circuit boards which comprises an insulating layer and a metal foil laminated to one side thereof.

As shown in FIG. 1, the substrate 100 for single-sided flexible circuit boards has a structure comprising an insulating layer 1, an adhesive layer 2, and a metal foil 3 which have been superposed in this order. Hereinafter, the multilayer structure composed of an insulating layer 1 and an adhesive layer 2 is referred to as a first multilayered insulating resin sheet 10.

The substrate 100 for single-sided flexible circuit boards is formed by laminating a metal foil 3 to an insulating layer 1 via an adhesive layer 2 at a predetermined temperature (hereinafter referred to as a laminating temperature). In this embodiment, the laminating temperature is set to a temperature not lower than the glass transition temperature $T_g$ of the first multilayered insulating resin sheet 10. The term laminating temperature herein means the temperature of the insulating layer 1 and adhesive layer 2 in the lamination step.

The metal foil 3 of the substrate 100 for single-sided flexible circuit boards is etched to thereby form a wiring pattern. Thus, a flexible printed wiring board is produced. The substrate in which the metal foil 3 has not been etched is the substrate 100 for single-sided flexible circuit boards, while the substrate in which the metal foil 3 has been etched is a flexible printed wiring board.

As the insulating layer 1 can be used an engineering plastic film such as a polyimide film, poly(parabanic acid) film, polyester film, poly(ethylene naphthalate) film, polyethersulfone film, polyetherimide film, or polyetheretherketone film.

As the adhesive layer 2 can be used a resin excellent in insulating properties and flexibility, such as a thermoplastic polyimide resin, a resin mixture of an epoxy resin and an acrylonitrile/butadiene rubber (NBR), a resin mixture of an epoxy resin and an acrylic rubber, a resin mixture of an epoxy resin and a polyester resin, or butyral.

As the metal foil 3 can be used a metal foil having excellent conductivity, such as a copper foil, aluminum foil, or nichrome foil. The surface of the metal foil 3 may be plated with a metal such as, e.g., tin, solder, gold, or nickel.

The thickness of the insulating layer 1 is set within the range of 12.5 to 50 μm. The thickness of the adhesive layer 2 is set within the range of 1 to 25 μm. The thickness of the metal foil 3 is set within the range of 12 to 38 μm.

Incidentally, those materials and thickness of the insulating layer 1, materials and thickness of the adhesive layer 2, and materials and thickness of the metal foil 3 described above are given for the purpose of showing examples. The materials and thicknesses of these layers should not be construed as being limited to those examples, and can be appropriately changed.

In this embodiment, the substrate 100 for single-sided flexible circuit boards is formed by laminating the metal foil 3 to the insulating layer 1 via the adhesive layer 2 at a temperature not lower than the glass transition temperature $T_g$ of the first multilayered insulating resin sheet 10. Due to this method, the flexible printed wiring board can be inhibited from suffering the dimensional change caused by internal stress after the etching of the metal foil 3 of the substrate 100 for single-sided flexible circuit boards. Consequently, parts to be mounted can be mounted on the flexible printed wiring board at the precise positions where the parts are to be mounted.

The laminating temperature, which is set to a temperature not lower than the glass transition temperature $T_g$ of the first multilayered insulating resin sheet 10, is preferably in the range of 100 to 400° C. This temperature regulation is effective in further diminishing the dimensional change of the flexible printed wiring board caused by internal stress after the etching of the metal foil 3 of the substrate 100 for single-sided flexible circuit boards.

Furthermore, the modulus of elasticity of the first multilayered insulating resin sheet 10 is preferably in the range of $1.0 \times 10^8$ to $1.0 \times 10^{10}$ Pa at the laminating temperature. This modulus range is effective in further diminishing the dimensional change of the flexible printed wiring board caused by internal stress after the etching of the metal foil 3 of the substrate 100 for single-sided flexible circuit boards.

In the first embodiment described above, the first multilayered insulating resin sheet 10 corresponds to the multilayered insulating resin layer as referred to in the present invention.

Second Aspect

Figure 2:
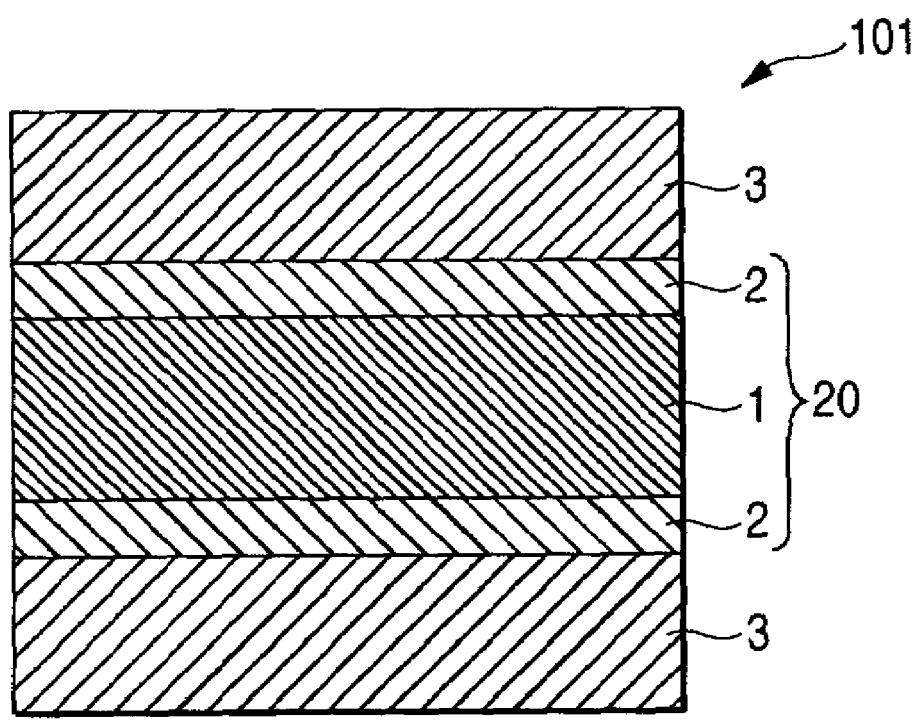
FIG. 2 is a sectional view illustrating one embodiment of the constitution of the substrate for flexible circuit boards according to the second aspect of the invention.

FIG. 2 is a sectional view illustrating one embodiment of the constitution of the substrate for flexible circuit boards according to the second aspect of the invention (This embodiment may be hereinafter sometimes referred to as "second embodiment"). The flexible-circuit substrate according to this embodiment is a substrate for double-sided flexible circuit boards which comprises an insulating layer and a metal foil laminated to both side thereof.

As shown in FIG. 2, the substrate 101 for double-sided flexible circuit boards has a structure comprising an insulating layer 1 having laminated to both side thereof an adhesive layer 2 and a metal foil 3 in this order. Hereinafter, the multilayer structure composed of an adhesive layer 2, an insulating layer 1, and another adhesive layer 2 is referred to as a second multilayered insulating resin sheet 20.

The substrate 101 for double-sided flexible circuit boards is formed by laminating metal foils 3 to an insulating layer 1 via adhesive layers 2 at a predetermined temperature (hereinafter referred to as a laminating temperature). In this embodiment, the laminating temperature is set to a temperature not lower than the glass transition temperature $T_g$ of the second multilayered insulating resin sheet 20.

The metal foils 3 of the substrate 101 for double-sided flexible circuit boards are etched to thereby form wiring patterns. Thus, a flexible printed wiring board is produced. The substrate in which the metal foils 3 have not been etched is the substrate 101 for double-sided flexible circuit boards, while the substrate in which the metal foils 3 have been etched is a flexible printed wiring board.

The materials and thicknesses of the insulating layer 1, adhesive layers 2, and metal foils 3 in this embodiment are as described above for the materials and thicknesses of the insulating layer 1, adhesive layer 2, and metal foil 3 in the first embodiment.

Incidentally, those materials and thickness of the insulating layer 1, materials and thickness of the adhesive layers 2, and materials and thickness of the metal foils 3 described above are given for the purpose of showing examples. The materials and thicknesses of these layers should not be construed as being limited to those examples, and can be appropriately changed.

In this embodiment, the substrate 101 for double-sided flexible circuit boards is formed by laminating the metal foils 3 to the insulating layer 1 via the respective adhesive layers 2 at a temperature not lower than the glass transition temperature $T_g$ of the second multilayered insulating resin sheet 20. Due to this method, the flexible printed wiring board can be inhibited from suffering the dimensional change caused by internal stress after the etching of the metal foils 3 of the substrate 101 for double-sided flexible circuit boards. Consequently, parts to be mounted can be mounted on the flexible printed wiring board at the precise positions where the parts are to be mounted.

The laminating temperature, which is set to a temperature not lower tan the glass transition temperature $T_g$ of the second multilayered insulating resin sheet 20, is preferably in the range of 100 to 400° C. This temperature range is effective in further diminishing the dimensional change of the flexible printed wiring board caused by internal stress after the etching of the metal foils 3 of the substrate 101 for double-sided flexible circuit boards.

Furthermore, the modulus of elasticity of the second multilayered insulating resin sheet 20 is preferably in the range of $1.0 \times 10^8$ to $1.0 \times 10^{10}$ Pa at the laminating temperature. This modulus range is effective in further diminishing the dimensional change of the flexible printed wiring board caused by internal stress after the etching of the metal foils 3 of the substrate 101 for double-sided flexible circuit boards.

In the second embodiment described above, the second multilayered insulating resin sheet 20 corresponds to the multilayered insulating resin layer as referred to in the present invention.

EXAMPLES

The present invention will be illustrated in greater detail with reference to the following Examples, but the invention should not be construed as being limited thereto.

Examples 1 to 3 and Comparative Examples 1 and 2

Flexible-circuit substrates of Examples 1 to 3 were produced according to the first or second embodiments, and flexible-circuit substrates of Comparative Examples 1 and 2 also were produced. The flexible-circuit substrates produced were subjected to the etching of the metal foil(s) 3 and then evaluated for the dimensional change of the flexible printed wiring board.

In Example 3 and Comparative Example 2, a substrate 100 for single-sided flexible circuit boards was used. In Examples 1 and 2 and Comparative Example 1, a substrate 101 for double-sided flexible circuit boards was used.

Table 1 shows the material and thickness (μm) of the insulating layer 1 in each of the substrates 100 for single-sided flexible circuit boards and substrates 101 for double-sided flexible circuit boards used in Examples 1–3 and Comparative Examples 1 and 2.

Table 2 shows the material and thickness (μm) of the adhesive layer(s) 2 and the material and thickness (μm) of the metal foil(s) 3 in each of the substrates 100 for single-sided flexible circuit boards and substrates 101 for double-sided flexible circuit boards used in Examples 1–3 and Comparative Examples 1 and 2.

Table 2 further shows the laminating temperatures (° C.), the moduli of elasticity (Pa) of the first multilayered insulating resin sheets 10 and second multilayered insulating resin sheets 20 as measured at the respective laminating temperatures, the glass transition temperatures $T_g$ (° C.) of the first multilayered insulating resin sheets 10 and second multilayered insulating resin sheets 20, and the dimensional changes MD and TD (%). The dimensional changes MD and TD will be explained in detail below.

TABLE 1

|  |  | Ex. 1 | Ex. 2 | Ex. 3 | Comp. Ex. 1 | Comp. Ex. 2 |
|---|---|---|---|---|---|---|
| Constitution |  |  |  |  |  |  |
| Single-sided or double-sided |  | double | double | single | double | single |
| Material |  |  |  |  |  |  |
| Insulating layer | First polyimide (Kapton 100 EN, manufactured by Du Pont-Toray Co., Ltd.) | 25 μm | — | — | — | — |
|  | Second polyimide (Apical 25HP, manufactured by Kanegafuchi Chemical Industry Co., Ltd.) | — | 18 μm | — | — | — |

TABLE 1-continued

|  |  | Ex. 1 | Ex. 2 | Ex. 3 | Comp. Ex. 1 | Comp. Ex. 2 |
|---|---|---|---|---|---|---|
|  | Third polyimide (Apical 25NPI, manufactured by Kanegafuchi Chemical Industry Co., Ltd.) | — | — | — | 25 μm | — |
|  | Poly(ethylene terephthalate) (Lumirror, manufactured by Toray Industries, Inc.) | — | — | 25 μm | — | 25 μm |

TABLE 2

|  |  | Ex. 1 | Ex. 2 | Ex. 3 | Comp. Ex. 1 | Comp. Ex. 2 |
|---|---|---|---|---|---|---|
| Constitution |  |  |  |  |  |  |
| Single-sided or double-sided |  | double | double | single | double | single |
| Material |  |  |  |  |  |  |
| Adhesive layer | Thermoplastic polyimide | 3 μm | 3 μm | — | 3 μm | — |
|  | Epoxy resin/polyester resin (manufactured by Nitto Denko Corp.) | — | — | 3 μm | — | 3 μm |
| Metal foil | First copper foil (electrolytic copper foil HLA2, manufactured by Nippon Denkai, Ltd.) | 18 μm | 18 μm | — | 18 μm | — |
|  | Second copper foil (electrolytic copper foil HLA2, manufactured by Nippon Denkai, Ltd.) | — | — | 18 μm | — | 18 μm |
| Laminating conditions |  |  |  |  |  |  |
| Laminating temperature (° C.) |  | 360 | 360 | 125 | 360 | 70 |
| Modulus of elasticity at laminating temperature (Pa) |  | $3.0 \times 10^8$ | $3.6 \times 10^8$ | $1.3 \times 10^9$ | $1.2 \times 10^9$ | $5.1 \times 10^9$ |
| Glass transition temperature, $T_g$ (° C.) |  | 334 | 306 | 112 | 407 | 112 |
| Dimensional changes |  |  |  |  |  |  |
| Dimensional change MD (%) |  | −0.067 | −0.037 | −0.058 | −0.21 | −0.11 |
| Dimensional change TD (%) |  | −0.059 | 0.034 | 0.011 | 0.16 | 0.12 |

In Examples 1 to 3 and Comparative Examples 1 and 2, first multilayered insulating resin sheets 10 and second multilayered insulating resin sheets 20 each having a size of 5 mm (width)×30 mm (length) were subjected as samples to a dynamic viscoelasticity examination test in order to determine the values of properties shown in Table 2, i.e., the glass transition temperatures $T_g$ of the first multilayered insulating resin sheets 10 and second multilayered insulating resin sheets 20 and the moduli of elasticity thereof at the respective laminating temperatures.

Incidentally, the thickness of each of the first multilayered insulating resin sheets 10 and second multilayered insulating resin sheets 20 is the sum of the thickness of the insulating layer 1 shown in Table 1 and the thickness of the adhesive layer(s) 2 shown in Table 2.

In the dynamic viscoelasticity examination test, solid viscoelasticity evaluation apparatus RSA-2 (manufactured by Rheometric Scientific FE. Ltd.) was used as a measuring apparatus. The examination mode used was the tensile mode, and the chuck-to-chuck distance was adjusted to 22.6 mm. The measuring temperatures were set to the range of from −50° C. to 500° C., and the heating rate and frequency were adjusted to 5° C./min and 1 Hz, respectively.

The temperature corresponding to the peak of the loss tangent, tan δ, calculated from loss modulus/storage modulus ratio was taken as the glass transition temperature $T_g$. In each of Examples 1 to 3, the glass transition temperature $T_g$ of the insulating layer 1, which was higher than the glass transition temperature $T_g$ of the adhesive layer(s) 2, was used as the glass transition temperature $T_g$ of the first multilayered insulating resin sheet 10 or second multilayered insulating resin sheet 20.

An explanation is then given on the evaluation of each of the substrates 100 for single-sided flexible circuit boards and substrates 101 for double-sided flexible circuit boards with respect to the dimensional change of the flexible printed wiring board after the etching of the metal foil(s) 3.

Figure 3:
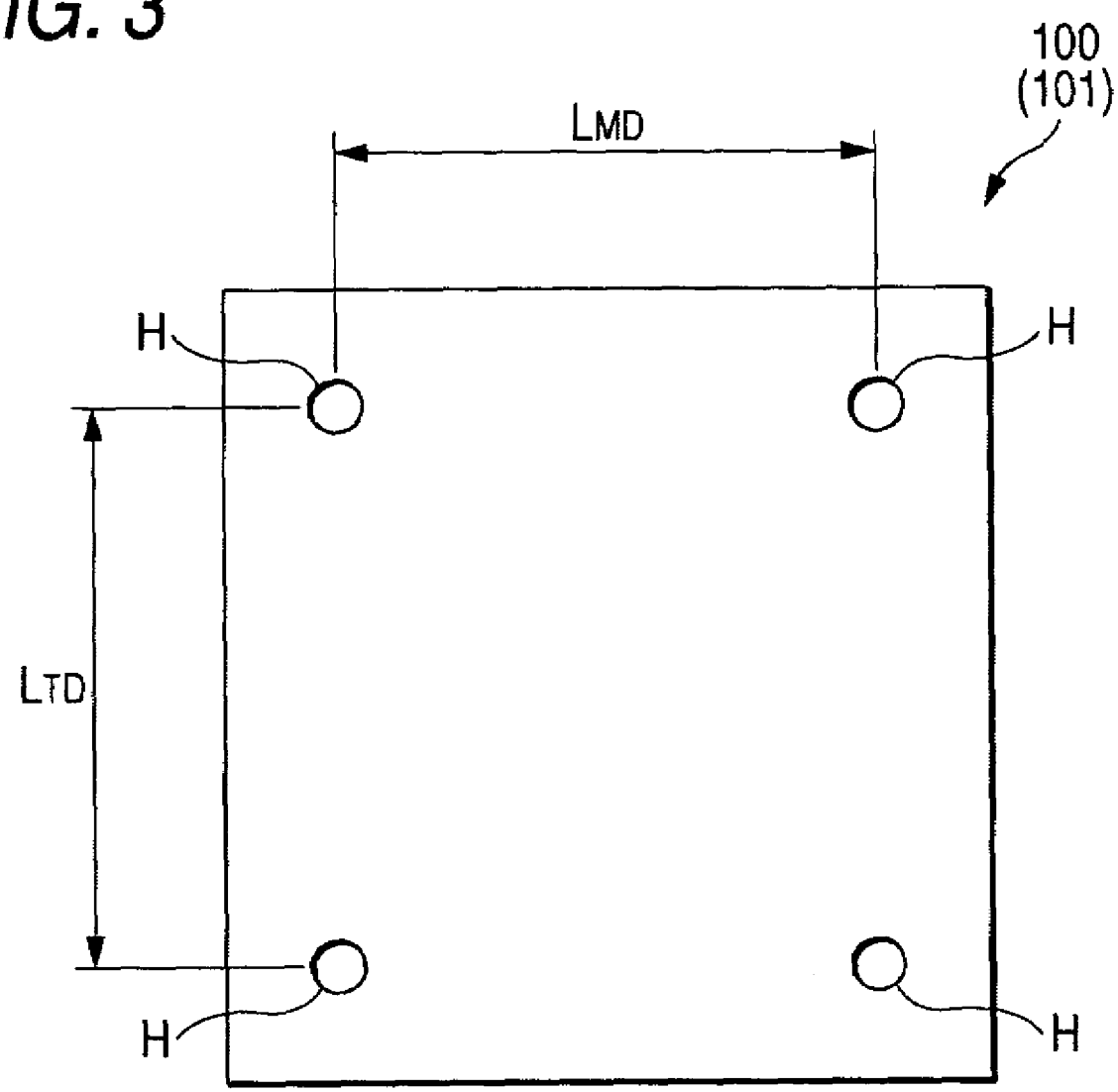
FIG. 3 is a diagrammatic plan view of the flexible-circuit substrate for the evaluation of dimensional change.

FIG. 3 is a diagrammatic plan view of a flexible-circuit substrate for dimensional change evaluation.

As shown in FIG. 3, the substrate 100 for single-sided flexible circuit boards or substrate 101 for double-sided flexible circuit boards has a hole H having a diameter of 0.5 mm in each of the four corners.

The distance between the respective centers of a pair of two holes H arranged in a direction parallel to the conveyance direction (machine direction) is referred to as dimension $L_{MD}$. The distance between the respective centers of a pair of two holes H arranged in a direction perpendicular to the conveyance direction (transverse direction) is referred to as dimension $L_{TD}$.

First, before the etching of the metal foil(s) 3, the dimensions $L_{MD}$ and $L_{TD}$ were measured beforehand by the method in accordance with IPC (The Institute for Interconnecting and Packaging Electronic Circuit) 650 2.2.4. The found values thereof are referred to as dimensions $L_{MD0}$ and $L_{TD0}$, respectively.

Subsequently, after selective removal of the metal foil(s) 3 by etching, each flexible printed wiring board was allowed to stand for 24 hours in a thermostatic chamber having a temperature of 23° C. and a humidity of 50% RH. Thereafter, dimensions $L_{MD}$ and $L_{TD}$ were measured again, and the found values thereof are referred to as dimensions $L_{MD1}$ and $L_{TD1}$, respectively.

The dimensional change MD(%) of the flexible printed wiring board in the conveyance direction was determined from the values of dimensions $L_{MD0}$ and $L_{MD1}$ by the equation:

$$MD(\%) = (L_{MD1} - L_{MD0})/L_{MD0} \times 100.$$

Furthermore, the dimensional change TD(%) of the flexible printed wiring board in the direction perpendicular to the conveyance direction was determined from the values of dimensions $L_{TD0}$ and $L_{TD1}$ by the equation:

$$TD(\%) = (L_{TD1} - L_{TD0})/L_{TD0} \times 100.$$

As shown in Table 2, Example 1 and Example 2 were equal to each other in the material and thickness of the adhesive layers 2 and the material and thickness of the metal foils 3, and were different in the material and thickness of the insulating layer 1. The laminating temperature was set so as to be not lower than the glass transition temperatures $T_g$ of the second multilayered insulating resin sheets 20.

As a result, in Example 1, the dimensional changes MD and TD were −0.067(%) and −0.059(%), respectively. Namely, the dimensional changes MD and TD in Example 1 each could be reduced to a value within the ±0.1(%) range. In Example 2, the dimensional changes MD and TD were −0.037(%) and 0.034(%), respectively. Namely, the dimensional changes MD and TD in Example 2 each could be reduced to a value within the ±0.1(%) range.

Example 3 and Comparative Example 2 were equal to each other in the material and thickness of the insulating layer 1, the material and thickness of the adhesive layer 2, and the material and thickness of the metal foil 3. In Example 3, the laminating temperature was set so as to be not lower than the glass transition temperature $T_g$ of the first multilayered insulating resin sheet 10. In Comparative Example 2, the laminating temperature was set so as to be lower than the glass transition temperature $T_g$ of the first multilayered insulating resin sheet 10.

As a result, in Example 3, the dimensional changes MD and TD were −0.058(%) and 0.011(%), respectively. Namely, the dimensional changes MD and TD in Example 3 each could be reduced to a value within the ±0.1(%) range. In Comparative Example 2, the dimensional changes MD and TD were −0.11(%) and 0.12(%), respectively. Namely, the dimensional changes MD and TD in Comparative Example 2 each could not be reduced to a value within the ±0.1(%) range.

Furthermore, in Comparative Example 1, the laminating temperature was set so as to be lower than the glass transition temperature $T_g$ of the second multilayered insulating resin sheet 20. As a result, the dimensional changes MD and TD each could not be reduced to a value within the ±0.1(%) range.

A comparison between the results of Examples 1 to 3 and the results of Comparative Examples 1 and 2 showed that the laminating temperature is preferably 100 to 400° C. and the modulus of elasticity of the first multilayered insulating resin sheet 10 or second multilayered insulating resin sheet 20 is preferably $1.0 \times 10^8$ to $1.0 \times 10^{10}$ Pa.

The process of the invention for producing a substrate for flexible circuit boards can be used, for example, for the production of flexible printed wiring boards.

While the present invention has been described in detail and with reference to specific embodiments thereof, it will be apparent to one skilled in the art that various changes and modifications can be made therein without departing from the spirit and scope thereof.

The present application is based on Japanese patent application No. 2003-411141 filed Dec. 10, 2003, the contents thereof being herein incorporated by reference.

What is claimed is:

1. A process for producing a substrate for flexible circuit boards which comprises:
    providing a multilayered insulating resin layer comprising an insulating layer and an adhesive layer; and
    laminating a metal foil to the insulating layer of the multilayered insulating resin layer via the adhesive layer at a temperature not lower than the glass transition temperature of the insulating layer.

2. The process for producing a substrate for flexible circuit boards of claim 1, wherein the laminating temperature is from 100° C. to 400° C., and the multilayered insulating resin layer has a modulus of elasticity of from $1.0 \times 10^8$ Pa to $1.0 \times 10^{10}$ Pa at the laminating temperature.

3. The process for producing a substrate for flexible circuit boards of claim 2,
    wherein the multilayered insulating layer has an adhesive layer on both side of the insulating layer, and
    wherein the lamination of a metal foil is carried out with respect to both sides of the multilayered insulating layer via the respective adhesive layers.

4. The process for producing a substrate for flexible circuit boards of claim 3, wherein the laminating temperature is from 100° C. to 400° C., and the multilayered insulating resin layer has a modulus of elasticity of from $1.0 \times 10^8$ Pa to $1.0 \times 10^{10}$ Pa at the laminating temperature.

* * * * *